US012713958B2

United States Patent
Zhao et al.

(12) United States Patent
(10) Patent No.: US 12,713,958 B2
(45) Date of Patent: Aug. 18, 2026

(54) PACKAGING SYSTEMS AND METHODS FOR SEMICONDUCTOR DEVICES

(71) Applicant: Avago Technologies International Sales Pte. Limited, Singapore (SG)

(72) Inventors: Sam Ziqun Zhao, Irvine, CA (US); Arun Ramakrishnan, Lake Forest, CA (US); Teong Swee Tan, Penang (MY)

(73) Assignee: Avago Technologies International Sales Pte. Limited, Singapore (SG)

( * ) Notice: Subject to any disclaimer, the term of this patent is extended or adjusted under 35 U.S.C. 154(b) by 558 days.

(21) Appl. No.: 18/296,597

(22) Filed: Apr. 6, 2023

(65) Prior Publication Data

US 2024/0339429 A1 Oct. 10, 2024

(51) Int. Cl.
*H10W 72/30* (2026.01)
*H10W 40/00* (2026.01)
(Continued)

(52) U.S. Cl.
CPC ........... *H10W 72/30* (2026.01); *H10W 40/00* (2026.01); *H10W 42/121* (2026.01);
(Continued)

(58) Field of Classification Search
CPC ....... H01L 24/16; H01L 23/16; H01L 21/563; H01L 24/13; H01L 24/83; H01L 23/562; H01L 24/29; H01L 24/32; H01L 24/73; H01L 23/34; H01L 24/33; H01L 21/568; H01L 24/27; H01L 24/45; H01L 23/544; H01L 25/0652; H01L 23/5386; H01L 25/0657; H01L 23/3128; H01L 23/3135; H01L 24/81; H01L 25/16; H01L 23/10; H01L 21/6836; H01L 23/49816; H01L 23/053; H01L 21/561; H01L 25/165; H01L 21/6835; H01L 21/486; H01L 23/5385; H01L 25/105; H01L 23/18; H01L 23/3675; H01L 23/367; H01L 25/18; H01L 25/50; H01L 23/3185; H01L 2224/73204; H01L 2224/27013; H01L 2224/32225; H01L 2224/26175; H01L 2224/33181;
(Continued)

(56) References Cited

U.S. PATENT DOCUMENTS 7,928,552 B1 * 4/2011 Cho .................. H01L 23/49827 257/E23.142
9,293,393 B2 3/2016 Hu et al.
(Continued)

OTHER PUBLICATIONS

European Patent Office, Extended Search Report, Application No. 24168708.6, Jan. 17, 2025, 23 pages.
(Continued)

*Primary Examiner* — Mouloucoulaye Inoussa
(74) *Attorney, Agent, or Firm* — Quarles & Brady LLP

(57) ABSTRACT

The present invention is directed to semiconductor devices and manufacturing methods thereof. In a specific embodiment, the present invention provides a semiconductor device that includes a filling material that supports the sides of an integrated circuit, which is coupled to a surface of a semiconductor substrate and surround by a ring structure. A portion of the filling material is positioned between the integrated circuit and the semiconductor substrate. There are other embodiments as well.

20 Claims, 9 Drawing Sheets

(51) Int. Cl.

| | |
|---|---|
| ***H10W 42/00*** | (2026.01) |
| ***H10W 72/00*** | (2026.01) |
| ***H10W 74/15*** | (2026.01) |
| ***H10W 90/00*** | (2026.01) |

(52) U.S. Cl.

CPC .... *H10W 72/07354* (2026.01); *H10W 72/347* (2026.01); *H10W 72/387* (2026.01); *H10W 74/15* (2026.01); *H10W 90/724* (2026.01); *H10W 90/734* (2026.01); *H10W 90/736* (2026.01)

(58) Field of Classification Search

CPC . H01L 2224/16227; H01L 2224/32245; H01L 2224/83101; H01L 2223/54486; H01L 2224/85455; H01L 2224/81464; H01L 2224/81469; H01L 2224/8146; H01L 2224/85132; H01L 2225/06517; H01L 2924/00014; H01L 2224/81471; H01L 2224/06135; H01L 2223/54426; H01L 2224/2919; H01L 2224/81424; H01L 2224/8546; H01L 2224/81455; H01L 2224/16225; H01L 2221/68327; H01L 2924/15311

See application file for complete search history.

(56) References Cited

U.S. PATENT DOCUMENTS

| | | | | |
|---|---|---|---|---|
| 9,390,993 | B2 | 7/2016 | Zhao et al. | |
| 10,008,439 | B2 | 6/2018 | Zhao et al. | |
| 10,615,110 | B2 | 4/2020 | Zhao et al. | |
| 2002/0028533 | A1* | 3/2002 | Tang | H01L 24/32 257/E21.503 |
| 2007/0132072 | A1* | 6/2007 | Chang | H01L 23/49833 257/E21.514 |
| 2011/0272807 | A1* | 11/2011 | Park | H01L 25/105 257/738 |
| 2014/0070396 | A1* | 3/2014 | Kyozuka | H01L 23/5389 257/698 |
| 2015/0262900 | A1* | 9/2015 | Wang | H01L 23/04 438/126 |
| 2016/0181218 | A1 | 6/2016 | Karhade et al. | |
| 2021/0066151 | A1* | 3/2021 | Hu | H01L 25/16 |
| 2021/0098332 | A1* | 4/2021 | Wang | H01L 21/50 |
| 2021/0242101 | A1* | 8/2021 | Kim | H01L 24/16 |
| 2022/0122896 | A1* | 4/2022 | Wang | H01L 25/105 |
| 2022/0165635 | A1* | 5/2022 | Park | H01L 23/562 |
| 2022/0246490 | A1* | 8/2022 | Yeh | H01L 23/3128 |
| 2022/0359331 | A1* | 11/2022 | Pan | H01L 21/76898 |
| 2022/0359345 | A1* | 11/2022 | Wang | H01L 25/50 |
| 2022/0359476 | A1* | 11/2022 | Hu | H01L 23/04 |
| 2023/0105359 | A1* | 4/2023 | Tsai | H01L 21/563 257/690 |
| 2023/0307318 | A1* | 9/2023 | Lee | H01L 23/3128 |
| 2024/0006434 | A1* | 1/2024 | Cho | H01L 23/3128 |
| 2024/0222309 | A1* | 7/2024 | Park | H01L 23/49838 |
| 2024/0321708 | A1* | 9/2024 | Lee | H01L 24/29 |
| 2024/0429194 | A1* | 12/2024 | Lee | H01L 23/13 |
| 2025/0022842 | A1* | 1/2025 | Lee | H01L 24/16 |
| 2025/0054828 | A1* | 2/2025 | Hung | H01L 24/73 |

OTHER PUBLICATIONS

European Patent Office, Partial Search Report, Application No. 24168708.6, Sep. 23, 2024, 19 pages.

* cited by examiner

600

700

800

PACKAGING SYSTEMS AND METHODS FOR SEMICONDUCTOR DEVICES

FIELD OF INVENTION

The present invention is directed to semiconductor devices and manufacturing methods thereof.

BACKGROUND OF THE INVENTION

Thermal management is an aspect in the design and packaging of integrated circuits (ICs). With the increasing demand for higher performance and power density in modern electronics, the heat generated by the ICs has become an important concern. Inadequate thermal management can lead to performance degradation, reliability issues, and even complete failure of the ICs. One of the major challenges in thermal management is to maintain the operating temperature of the IC within a specified range, which can vary depending on the type of IC and its application. Another challenge is to ensure the efficient transfer of heat from the IC to the package, which in turn needs to be dissipated to the environment. The design and material selection of the package play an important role in thermal management. A package with good thermal conductivity and low thermal resistance helps ensure efficient heat transfer. Another challenge is the limited space available in compact packages, which makes it difficult to integrate effective cooling solutions. Additionally, the thermal expansion of the different materials in the package and their compatibility with the IC can also lead to thermal management issues. Overall, thermal management in IC packaging requires a careful balance between design, material selection, and the optimization of thermal performance.

Over the past, various conventional systems and methods have been described, but they are inadequate for reasons explained below. New and improved packaging systems and methods for semiconductor devices are desired.

BRIEF DESCRIPTION OF THE DRAWINGS

A further understanding of the nature and advantages of particular embodiments may be realized by reference to the remaining portions of the specification and the drawings, in which like reference numerals are used to refer to similar components. In some instances, a sub-label is associated with a reference numeral to denote one of multiple similar components. When reference is made to a reference numeral without specification to an existing sub-label, it is intended to refer to all such multiple similar components.

DETAILED DESCRIPTION OF THE INVENTION

The present invention is directed to semiconductor devices and manufacturing methods thereof. In a specific embodiment, the present invention provides a semiconductor device that includes a filling material that supports the sides of an integrated circuit, which is coupled to a surface of a semiconductor substrate and surrounded by a ring structure. There are other embodiments as well.

Various industry standards for thermal management, such as chip thermal resistance Theta-JA, are based on air cooling. However, the increasing demand for high-performance computing (HPC) applications like artificial intelligence and cloud computing is driving up device power dissipation to over 1,000 W. This growth is hindered by lidded packages and its components' thermal resistance (e.g., measured by the property of thermal interface material, or TIM1). For example, exposed die packages may offer a 50-80% reduction in junction-to-case (Theta-jc) thermal resistance value, allowing for higher power dissipation, but are vulnerable to backside die damage caused by external heatsink mechanical contact induced stresses. To improve the reliability of exposed die flip chip packages and advance air cooling for high-power devices, die protection for air-cooled heatsinks is provided.

Figure 1:
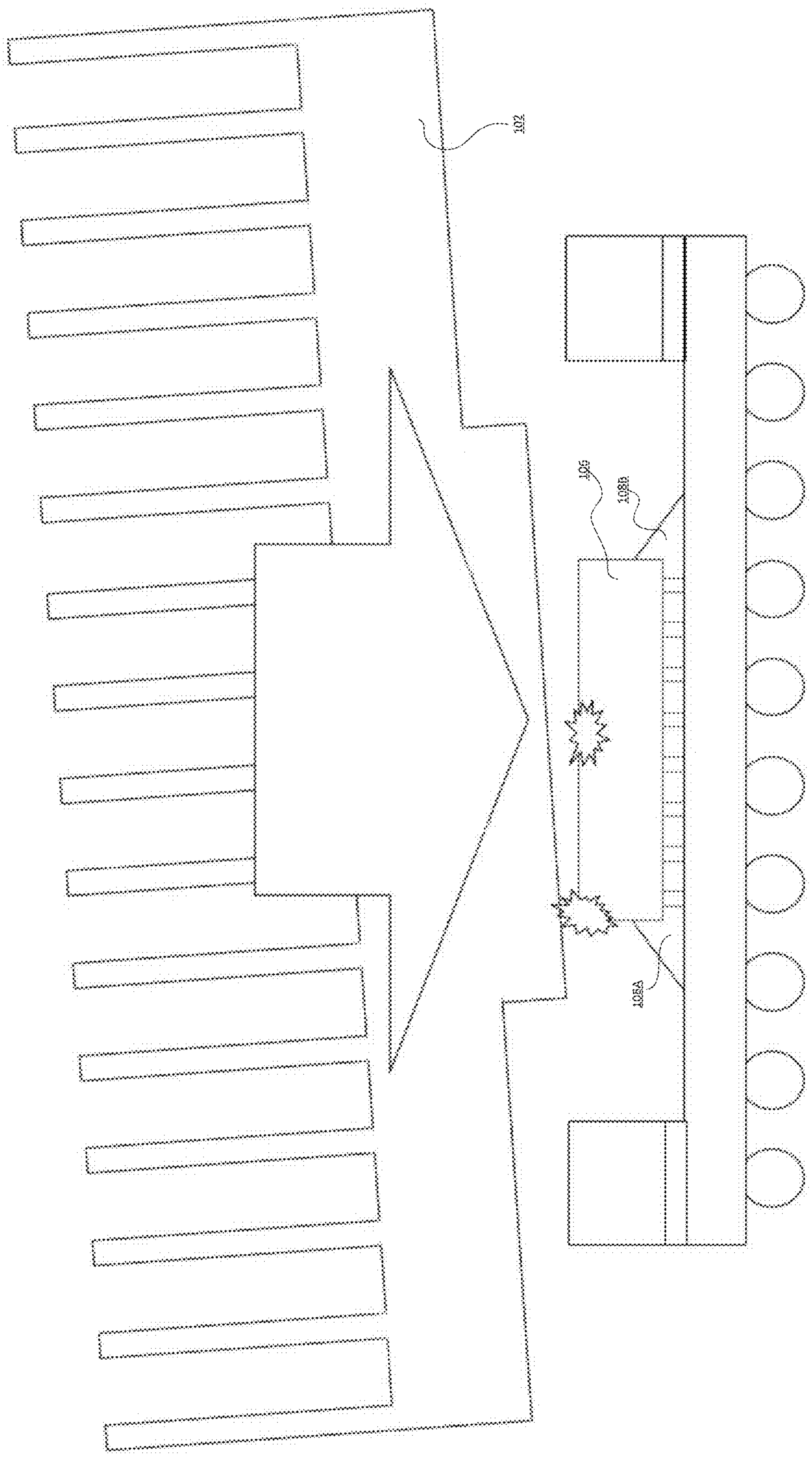
FIG. 1 is a simplified diagram illustrating a flip chip device.

FIG. 1 is a simplified diagram illustrating a flip chip device. As an example, a flip chip is a type of integrated circuit packaging where the active side of the die (the side with transistors and other components) faces down and is directly attached to the substrate or package. Unlike traditional IC packaging methods where the die is wire bonded to the package, flip chip technology uses bumps or balls of solder to make electrical connections between the die and substrate. This direct connection allows for a reduction in the distance between the die and substrate, resulting in improved electrical performance. Flip chip technology also allows for higher-density packaging, making it suitable for high-performance and high-power applications, such as computer graphics cards and processors. In FIG. 1, heat sink 102 is mounted on die 106. For, in semiconductor packaging, a "die" refers to a small piece of semiconductor material or an integrated circuit that contains the active components of a microchip, such as transistors, diodes, and resistors. An exposed die, such as die 106, is susceptible to backside damage due to mechanical stress from contacting the heat sink 102. For instance, when the heat sink 102 is tilted, as shown in FIG. 1, it creates concentrated forces on the edges and corners of die 106. This stress can also be attributed to the flatness of the heat sink contact surface. Furthermore, mechanical shock and vibration during the manufacturing process, testing, transportation, and use can lead to further damage. To address these issues and improve the reliability of exposed die flip chip packages, embodiments of the present disclosure provide structures and mechanisms, including the use of underfill materials 108A and 108B, that enhance the device reliability for the air cooled heat sink system shown in FIG. 1.

The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to all papers and documents which are filed concurrently with this specification and which are open to public inspection with this specification, and the contents of all such papers and documents are incorporated herein by reference. All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the Claims herein is not intended to invoke the provisions of 35 U.S.C. 112, Paragraph 6.

Please note, if used, the labels left, right, front, back, top, bottom, forward, reverse, above, below, clockwise and counterclockwise have been used for convenience purposes only and are not intended to imply any particular fixed direction. Instead, they are used to reflect relative locations and/or directions between various portions of an object.

When an element is referred to herein as being "connected" or "coupled" to another element, it is to be understood that the elements can be directly connected to the other element, or have intervening elements present between the elements. In contrast, when an element is referred to as being "directly connected" or "directly coupled" to another element, it should be understood that no intervening elements are present in the "direct" connection between the elements. However, the existence of a direct connection does not exclude other connections, in which intervening elements may be present.

When an element is referred to herein as being "disposed" in some manner relative to another element (e.g., disposed on, disposed between, disposed under, disposed adjacent to, or disposed in some other relative manner), it is to be understood that the elements can be directly disposed relative to the other element (e.g., disposed directly on another element), or have intervening elements present between the elements. In contrast, when an element is referred to as being "disposed directly" relative to another element, it should be understood that no intervening elements are present in the "direct" example. However, the existence of a direct disposition does not exclude other examples in which intervening elements may be present.

Similarly, when an element is referred to herein as being "bonded" to another element, it is to be understood that the elements can be directly bonded to the other element (without any intervening elements) or have intervening elements present between the bonded elements. In contrast, when an element is referred to as being "directly bonded" to another element, it should be understood that no intervening elements are present in the "direct" bond between the elements. However, the existence of direct bonding does not exclude other forms of bonding, in which intervening elements may be present.

Likewise, when an element is referred to herein as being a "layer," it is to be understood that the layer can be a single layer or include multiple layers. For example, a conductive layer may comprise multiple different conductive materials or multiple layers of different conductive materials, and a dielectric layer may comprise multiple dielectric materials or multiple layers of dielectric materials. When a layer is described as being coupled or connected to another layer, it is to be understood that the coupled or connected layers may include intervening elements present between the coupled or connected layers. In contrast, when a layer is referred to as being "directly" connected or coupled to another layer, it should be understood that no intervening elements are present between the layers. However, the existence of directly coupled or connected layers does not exclude other connections in which intervening elements may be present.

Moreover, the terms left, right, front, back, top, bottom, forward, reverse, clockwise and counterclockwise are used for purposes of explanation only and are not limited to any fixed direction or orientation. Rather, they are used merely to indicate relative locations and/or directions between various parts of an object and/or components.

Furthermore, the methods and processes described herein may be described in a particular order for ease of description. However, it should be understood that, unless the context dictates otherwise, intervening processes may take place before and/or after any portion of the described process, and further various procedures may be reordered, added, and/or omitted in accordance with various embodiments.

Unless otherwise indicated, all numbers used herein to express quantities, dimensions, and so forth should be understood as being modified in all instances by the term "about." In this application, the use of the singular includes the plural unless specifically stated otherwise, and use of the terms "and" and "or" means "and/or" unless otherwise indicated. Moreover, the use of the terms "including" and "having," as well as other forms, such as "includes," "included," "has," "have," and "had," should be considered non-exclusive. Also, terms such as "element" or "component" encompass both elements and components comprising one unit and elements and components that comprise more than one unit, unless specifically stated otherwise.

As used herein, the phrase "at least one of" preceding a series of items, with the term "and" or "or" to separate any of the items, modifies the list as a whole, rather than each member of the list (i.e., each item). The phrase "at least one of" does not require selection of at least one of each item listed; rather, the phrase allows a meaning that includes at least one of any one of the items, and/or at least one of any combination of the items. By way of example, the phrases "at least one of A, B, and C" or "at least one of A, B, or C" each refers to only A, only B, or only C; and/or any combination of A, B, and C. In instances where it is intended that a selection be of "at least one of each of A, B, and C," or alternatively, "at least one of A, at least one of B, and at least one of C," it is expressly described as such.

One general aspect includes a semiconductor device that includes a substrate that may include a first top surface and a first bottom surface, the first top surface may include a first plurality of electrical contacts. The device also includes a first plurality of electrical connections directly coupled to the first plurality of electrical contacts. The device also includes a circuit that may include a second top surface and a second bottom surface, the second bottom surface may include a second plurality of electrical contacts, the second plurality of electrical contacts being directly coupled to the first plurality of electrical connections. The circuit may include a first side surface and a second side surface. The device also includes a ring structure coupled to the substrate and positioned around the circuit, the ring structure comprising a third top surface, a height difference between the second top surface and the third top surface being less than 100 μm. The device also includes a filling material that may include a first portion and a second portion, the first portion being directly coupled to the first plurality of electrical connections and the second bottom surface, the second portion being in direct contact with the first side surface, the filling material being positioned between the circuit and the ring structure.

According to another embodiment, the present invention provides a semiconductor device that includes a substrate that includes a first top surface and a first bottom surface, the first top surface may include a first plurality of electrical contacts, the first bottom surface may include a second plurality of electrical contacts, the substrate may include a ring structure. The device also includes a first plurality of electrical connections directly coupled to the first plurality of electrical contacts, the first plurality of electrical connections being positioned within the ring structure. The device also includes a second plurality of electrical connections directly coupled to the second plurality of electrical contacts. The device also includes a circuit that may include a second top surface and a second bottom surface, the second bottom surface may include a second plurality of electrical contacts, the second plurality of electrical contacts being directly coupled to the first plurality of electrical connections, the circuit may include a first side surface and a second side surface. The device also includes a filling material that may include a first portion and a second portion, the first portion being directly coupled to the first plurality of electrical connections and the second bottom surface, the second portion being in direct contact with the first side surface and the ring structure.

According to yet another embodiment, the present invention provides a semiconductor device that includes a substrate that includes a first top surface and a first bottom surface. The first top surface may include a first plurality of electrical contacts, the first bottom surface may include a second plurality of electrical contacts. The device also includes a ring structure positioned on a first location of the first top surface. The device also includes a first plurality of electrical connections directly coupled to the first plurality of electrical contacts, the first plurality of electrical connections being positioned within the ring structure. The device also includes a circuit that may include a second top surface and a second bottom surface, the second bottom surface may include a second plurality of electrical contacts, the second plurality of electrical contacts being directly coupled to the first plurality of electrical connections, the circuit may include a first side surface and a second side surface. The device also includes a filling material that may include a first portion and a second portion, the first portion being directly coupled to the first plurality of electrical connections and the second bottom surface, the second portion being in direct contact with the first side surface and the ring structure, a height difference between the second portion the second top surface being less 100 um.

Figure 2:
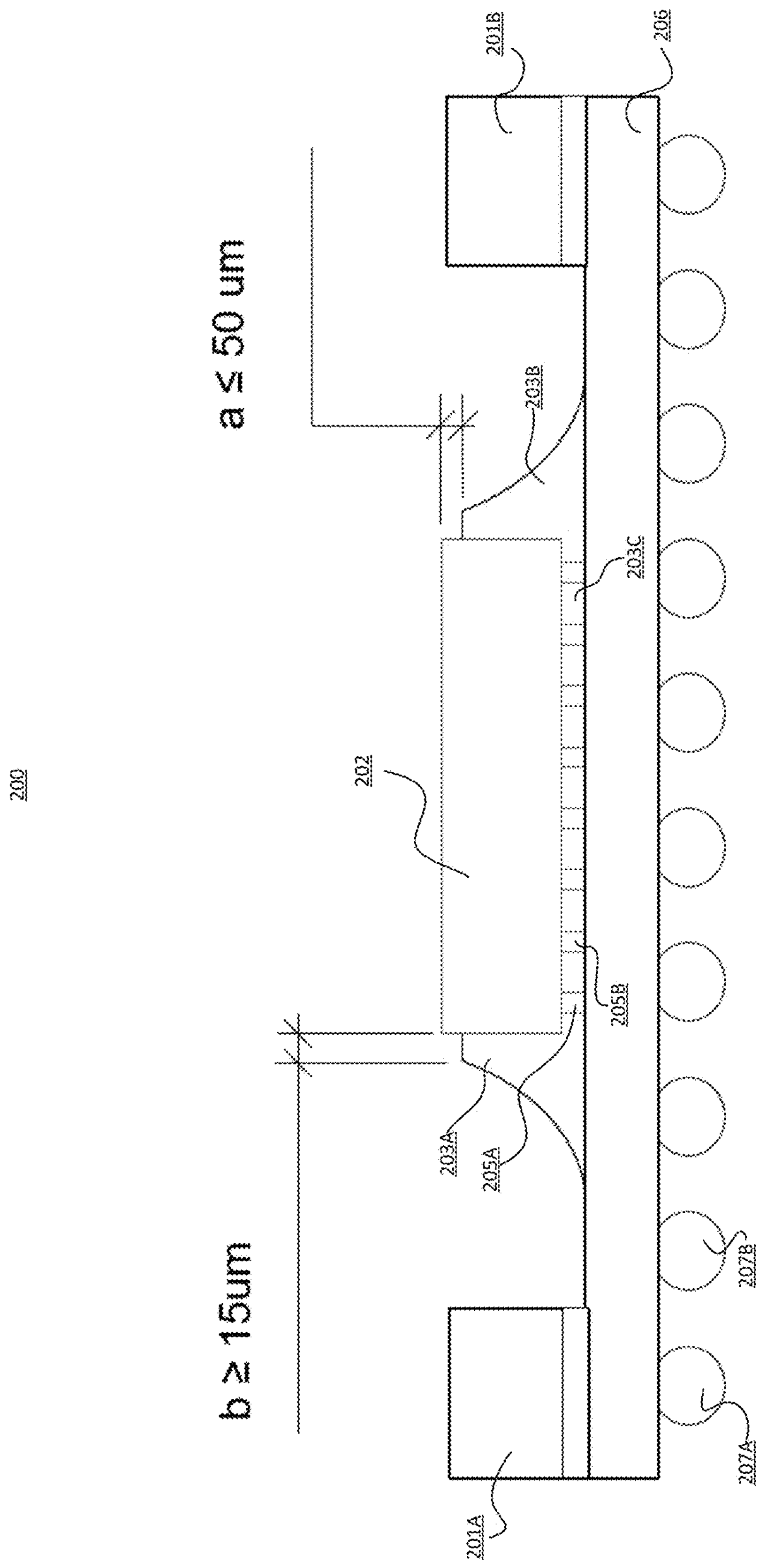
FIG. 2 is a simplified diagram illustrating a semiconductor device with an underfill support structure according to embodiments of the present invention.

FIG. 2 is a simplified diagram illustrating a semiconductor device with an underfill support structure according to embodiments of the present invention. This diagram is merely an example, which should not unduly limit the scope of the claims. One of ordinary skill in the art would recognize many variations, alternatives, and modifications. Semiconductor device 200 as illustrated in FIG. 2, includes a substrate 206. As an example, a substrate may serve as the base material for mounting and interconnecting the active components, such as transistors, diodes, and integrated circuits. For example, substrate 206 may be made of a material that is an insulator or a low-resistivity conductor, such as ceramic or fiberglass. Depending on the implementation, substrate 206 can have one or more metal layers added to it, forming a metal-insulator-metal (MIM) or metal-insulator-semiconductor (MIS) structure, which allows for the electrical connections between the active components and to the external environment. These metal layers can be patterned to form interconnections, bond pads, and other features that allow for the electrical and mechanical connection of the package to the outside world. In some packages, such as ball grid array (BGA) packages, substrate 206 may also have a layer of conductive balls or bumps that provide the electrical connection to the external environment. The substrate in a semiconductor package can also have via holes or trenches filled with metal to provide electrical connections between metal layers or to the opposite side of the substrate.

Substrate 206 includes a top surface and a bottom surface as shown. For example, the top surface includes electrical contacts (e.g., through MIMI or MIS structures) for coupling to circuit 202. For example, electrical contacts include conductive points or surfaces that allow electrical current to flow between two or more electrical devices or components, providing a path for the flow of electrons and allowing the transfer of electrical energy and signals. Electrical contacts can be made of various materials, such as metals (such as copper, gold, and silver), alloys, or conductive polymers. The bottom surface of substrate 206 also includes electrical contacts, which are directly coupled to electrical connections 207A, 207B, and others. As an example, electrical connections may include BGA balls, solder connections, wires, and others.

Circuit 202 is electrically coupled to the electrical contacts of the substrate via electrical connections (e.g., electrical connections 205A, 205B, and others). In various embodiments, electrical connections comprise solder points that provide both electrical and mechanical coupling between circuit 202 and substrate 206. As an example, circuit 202 comprises an integrated circuit, and it may also be referred to as a chip, or die, depending on context. As an example, the soldering process for coupling the substrate and circuit 202 involves using a metal alloy (solder) that is melted and then solidified to create a strong mechanical and electrical bond. The soldering process can be performed using various techniques, including surface-mount technology (SMT), reflow soldering, or others.

A layer of thermal interface material (not shown in FIG. 2) is provided on the top surface of circuit 202, and it is positioned between circuit 202 and a heat sink (not shown in FIG. 2). As an example, thermal interface material (TIM) is a material used to improve the thermal conductivity between circuit 202 and the heat sink, and it fills the gap between the circuit and the heat sink, reducing the thermal resistance and allowing heat to be efficiently transferred from circuit 202 to the heat sink. For example, TIM comprises one or more materials with high thermal conductivity (e.g., typically around 1 W/m-K to as 1 W/m-K, but can be much higher with materials such as graphene), such as metals (such as aluminum, copper, or silver), ceramics, or polymer composites. Depending on the implementation, TIM can be in the form of a paste, a sheet, or a pre-formed shape that is placed between circuit 202 and the heat sink. The heat sink, thermally coupled to circuit 202 via the TIM, dissipates heat generated by circuit 202. It acts as a thermal conduit, transferring the heat generated by circuit 202 through the TIM and the heat sink to the environment, thereby keeping the temperature of circuit 202 within acceptable limits. For example, the heat sink comprises materials with high thermal conductivity, such as aluminum, copper, or graphite. Depending on the implementation, the heat sink can be in the form of a simple block, a finned structure, or a more complex shape with multiple fins.

A heat sink has a large surface area to maximize heat dissipation. When a heat sink is coupled to a circuit only via a layer of TIM without heat spreaders, thermal conductivity and reliably are improved compared to approaches that involve heat spreaders and additional TIM layers. At the same time, direct mounting (e.g., without a layer of TIM between) of a heat sink on a circuit may cause mechanical and other issues illustrated in FIG. 1 and described above. For example, tilting of a heat sink (e.g., due to physical impact, movement, etc.) may cause damage to the circuit and undesirable separation from the TIM. As shown in FIG. 2, filling material (e.g., including regions 203A, 203B, and 203C) provides support for circuit 202 as shown. For example, region 203A provides support on the left side of circuit 202, and region 203B provides support on the right side of circuit 202. In various embodiments, the top portions of region 203A and region 203B are at least 15 um wide (e.g., "b≥1") and less than 50 um (e.g., "a≤50 um") from the top surface of circuit 202; the width and proximity of region 203A and region 203B provide additional structural support for circuit 202 to interface with the heat sink. In various embodiments, the distance "a" between region 203A and the top surface of circuit 202 may be defined by a relative thickness, where 0≤a≤¼ of circuit 202 thickness; width of the top portion of region 203A and 203B may be defined by a relative width, where 0≤b≤5 times of circuit 202 thickness. Region 203A and region 203B, as shown, include a curved profile, which may attribute to a free surface curing process during formation, and other shapes may be possible as well.

As an example, filling material may refer to an underfill. Underfill is a process in which a material is filled in between the circuit and the substrate to enhance the mechanical stability and reliability of the package. In various embodiments, the filling material comprises resin (e.g., semi-transparent and/or translucent) and filler material. For example, the underfill material may comprise a thermosetting epoxy resin that is dispensed as a liquid between the circuit and the substrate, and then cured to form a solid. Filling material, illustrated in FIG. 2, provides support and helps to distribute stress from circuit 202 to substrate 206, reducing the thermal stress and mechanical stress that the electrical interconnects 205 between circuit 202 and substrate 206 would otherwise experience during thermal cycling and mechanical shock. Among other features, filling material improves the reliability and performance of semiconductor device 200. The filling material can also provide electrical and thermal benefits. For example, it can improve the electrical performance by reducing parasitic capacitance between circuit 202 and substrate 206, which as shown are connected to each other via electrical connections 205A, 205B, and other solder points. In various embodiments, filling material is thermally conductive and can help to dissipate heat generated from circuit 202.

Semiconductor device 200 may include other components as well, such as sidewalls 201A and 202B that provide mechanical support and/or insulation.

Figure 3A:
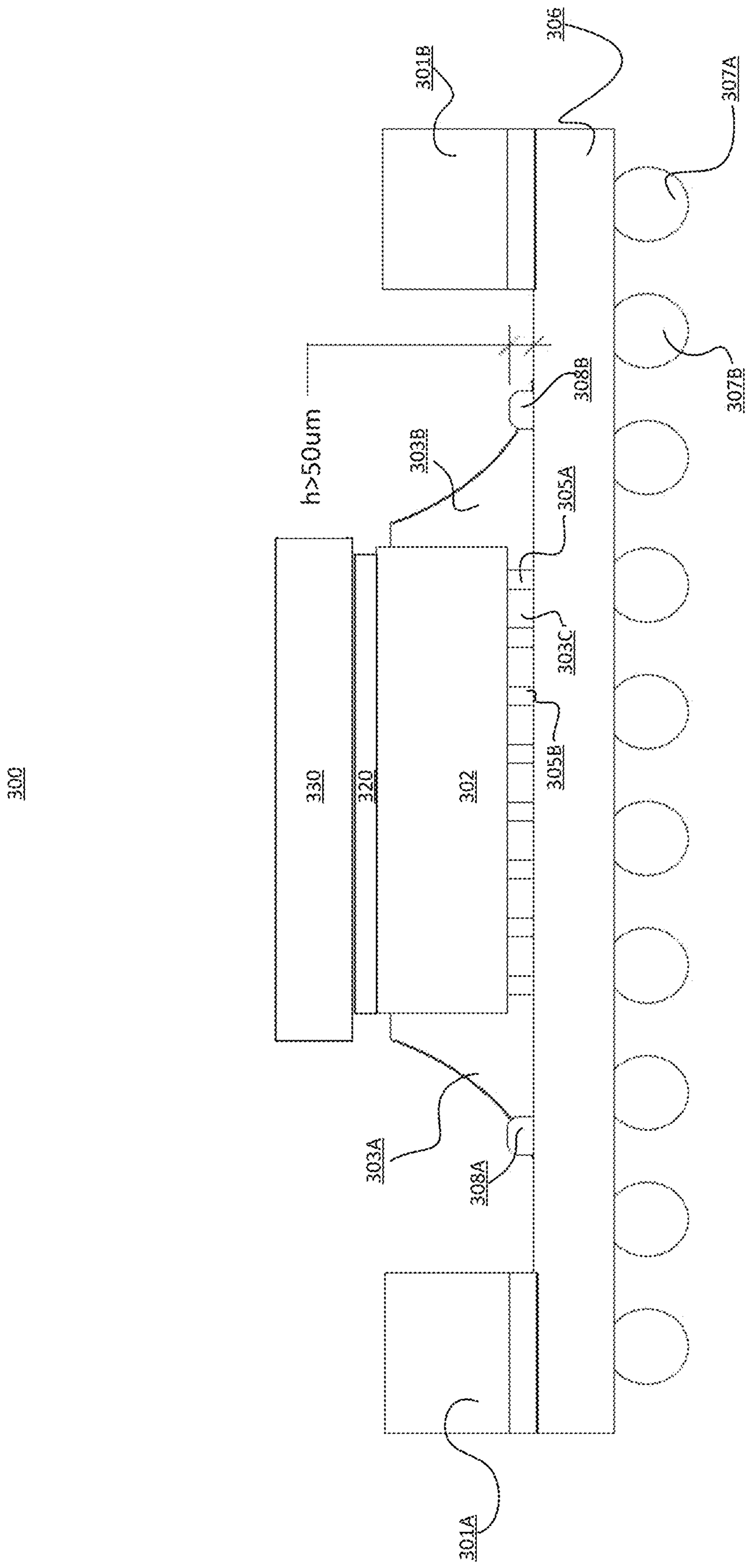
FIGS. 3A and 3B are simplified diagrams illustrating a semiconductor device with an underfill support structure positioned between ring structures according to embodiments of the present invention.
Figure 3B:
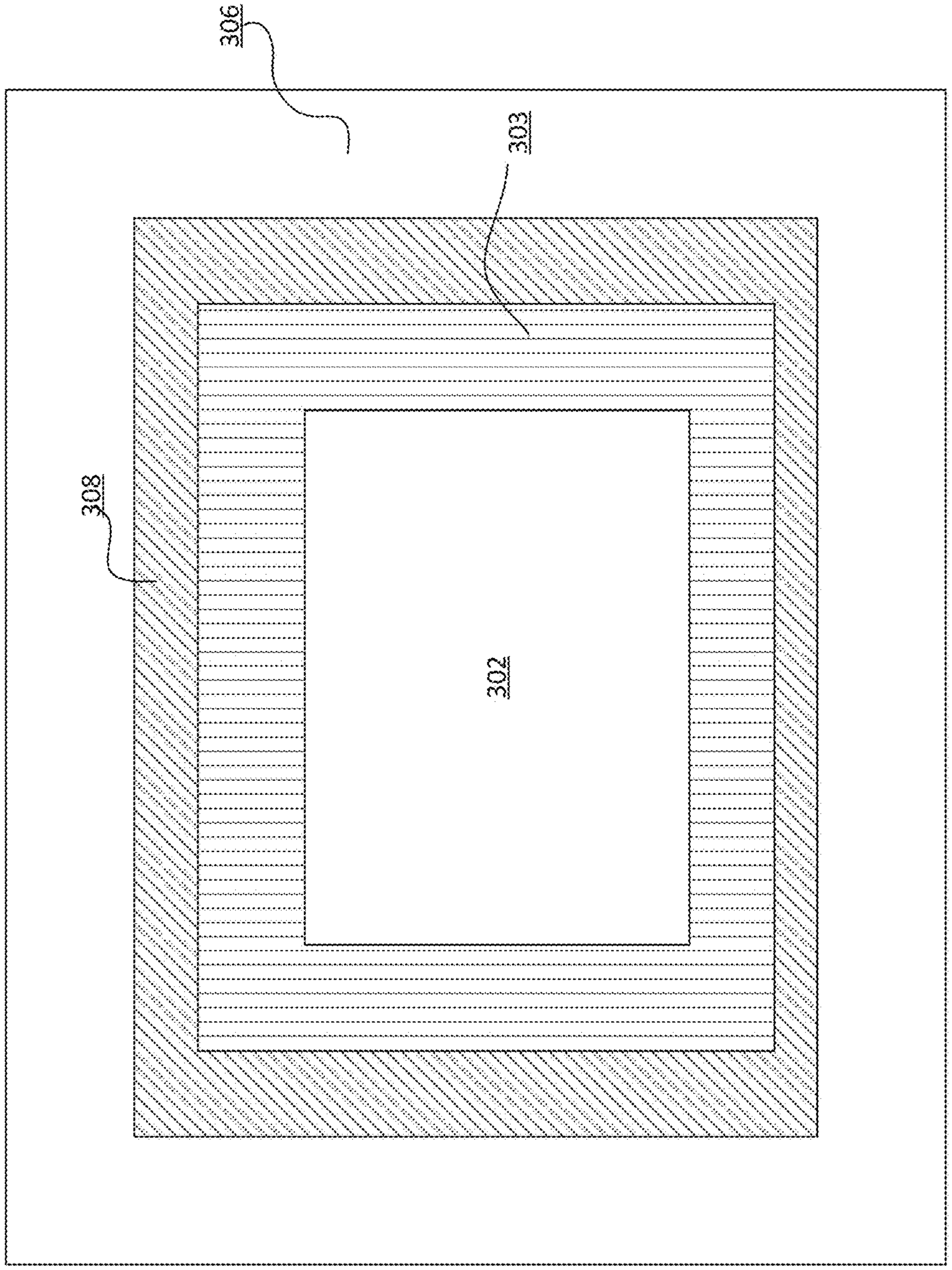

FIGS. 3A and 3B are simplified diagrams illustrating a semiconductor device with an underfill support structure positioned between ring structures according to embodiments of the present invention. These diagrams merely provide an example, which should not unduly limit the scope of the claims. One of ordinary skill in the art would recognize many variations, alternatives, and modifications.

Semiconductor device 300 as illustrated in FIG. 3A, includes substrate 306. As an example, a substrate may serve as the base material for mounting and interconnecting the active components, such as transistors, diodes, and integrated circuits. For example, substrate 306 may be made of a material that is an insulator or a low-resistivity conductor, such as ceramic or fiberglass. Depending on the implementation, substrate 306 can have one or more metal layers added to it, forming a metal-insulator-metal or metal-insulator-semiconductor structure, which allows for the electrical connections between the active components and to the external environment. These metal layers can be patterned to form interconnections, bond pads, and other features that allow for the electrical and mechanical connection of the package to the outside world. In some packages, such as ball grid array packages, substrate 306 may also include a layer of conductive balls or bumps that provide the electrical connection to the external environment. The substrate in a semiconductor package can also have via holes or trenches filled with metal to provide electrical connections between metal layers or to the opposite side of the substrate.

Substrate 306 includes a top surface and a bottom surface as shown. For example, the top surface includes electrical contacts (e.g., through MIMI or MIS structures) for coupling to circuit 302. For example, electrical contacts include conductive points or surfaces that allow electrical current to flow between two or more electrical devices or components, providing a path for the flow of electrons and allowing the transfer of electrical energy and signals. Electrical contacts can be made of various materials, such as metals (such as copper, gold, and silver), alloys, or conductive polymers. The bottom surface of substrate 306 also includes electrical contacts, which are directly coupled to electrical connections 307A, 307B, and others. As an example, electrical connections may include BGA balls, solder connections, wires, and others.

Circuit 302 is electrically coupled to the electrical contacts of the substrate via electrical connections (e.g., electrical connections 305A, 305B, and others). In various embodiments, electrical connections comprise solder points that provide both electrical and mechanical coupling between circuit 302 and substrate 306. As an example, circuit 302 comprises an integrated circuit, and it may also be referred to as a chip, or die, depending on context. As an example, the soldering process for coupling the substrate and circuit 302 involves using a metal alloy (solder) that is melted and then solidified to create a strong mechanical and electrical bond. The soldering process can be performed using various techniques, including surface-mount technology, reflow soldering, or others.

Layer 320 is provided between circuit 202 and heat sink 330. As explained above, thermal interface material is a material used to improve the thermal conductivity between circuit 302 and heat sink 330. Layer 320 fills the gap between circuit 320 and the heat sink 330, reducing the thermal resistance and allowing heat to be efficiently transferred from circuit 302 to the heat sink. For example, TIM comprises one or more materials with high thermal conductivity (e.g., at least 1 W/m-K, but may be as high as 10 W/m-K, or even high with materials such as graphene), such as metals (such as aluminum, copper, or silver), ceramics, or polymer composites. Depending on the implementation, TIM can be in the form of a paste, a sheet, or a pre-formed shape that is placed between circuit 302 and heat sink 330. Heat sink 330, thermally coupled to circuit 302 via layer 320, dissipates heat generated by circuit 302. Heat sink 330 acts as a thermal conduit, transferring the heat generated by circuit 302 to the environment, thereby keeping the temperature of circuit 302 within acceptable limits. For example, the heat sink comprises materials with high thermal conductivity, such as aluminum, copper, or graphite. Depending on the implementation, the heat sink can be in the form of a simple block, a finned structure, or a more complex shape with multiple fins.

Heat sink 330 has a large surface area (e.g., larger than the surface area of circuit 320) to maximize heat dissipation. When a heat sink is coupled to a circuit only via a layer of TIM without heat spreaders, thermal conductivity and reliably are improved compared to approaches that involve heat spreaders and additional TIM layers. At the same time, direct mounting (e.g., without a layer of TIM between) of a heat sink on a circuit may cause mechanical and other issues illustrated in FIG. 1 and described above. For example, tilting of a heat sink (e.g., due to physical impact, movement, etc.) may cause damage to the circuit and undesirable separation from the TIM. As shown in FIG. 3, filling material (e.g., including regions 303A, 303B, and 303C) is provided between circuit 302 and ring structures (e.g., ring structure regions 308A and 308B in FIG. 3A, or ring structure 308 shown in FIG. 3B). FIG. 3B shows ring structure 308 characterized by a rectangular ring shape, but it is understood ring structure can be in other shapes as well, such as circular ring, rounded square ring, and other geometric or non-geometric shapes. For example, region 303A provides support on the left side of circuit 302, and region 303B provides support on the right side of circuit 302. As an example, the term "ring structure" refers to a barrier that constrains the filling material within the space within the ring structure; depending on the implementation and literature, the term "ring structure" may also be referred to as a dam structure, an underfill modifier, a ring modifier, or others, and it should limit the scope of the claims.

Region 303A of the filling material is positioned between ring structure 308A and circuit 302, and region 303B is provided between ring structure 308B and circuit 302. According to various implementations, the height of ring structures 308A and 308B is preferably between 20 μm and half of the height of circuit 302 (e.g., 20 um≤h≤½ die height), and may be between 10 μm and the height of circuit 302 (e.g., 20 um≤h≤½ die height). For example, letter "h" used is an abbreviation of word "height", and it can be used to refer to the heights of different element as labeled or explained in the text. In various implementations, the height of the ring structure matches the desired thickness of the encapsulation material, and the width is wide enough to provide a stable foundation for the molding process.

As an example, filling material (e.g., including regions 303A, 303B, and 303C in FIG. 3) may refer to an underfill. Underfill is a process in which a material is filled in between the circuit and the substrate to enhance the mechanical stability and reliability of the package. In various embodiments, the filling material comprises resin (e.g., semi-transparent and/or translucent) and filler material. For example, the underfill material may comprise a thermosetting epoxy resin that is dispensed as a liquid between the circuit and the substrate, and then cured to form a solid. Filling material, illustrated in FIG. 3, provides support and helps to distribute stress from circuit 302 to substrate 306, reducing the thermal stress and mechanical stress that circuit 302 would otherwise experience during thermal cycling and mechanical shock, especially with a heat sink mounted on its top via a TIM later. Among other features, filling material improves the reliability and performance of semiconductor device 300. The filling material can also provide electrical and thermal benefits. For example, it can improve the electrical performance by reducing parasitic capacitance between circuit 302 and substrate 306, which as shown are connected to each other via electrical connections 305A, 305B, and other solder points. In various embodiments, filling material is thermally conductive and can help to dissipate heat generated by circuit 302.

As an example, a ring structure refers to a raised structure that provides a physical barrier to contain the flow of filling material (e.g., 303A and 303B), and it prevents the filling material from spreading into undesired regions (e.g., the region between ring structure 308A and sidewall 301A). In various embodiments, a ring structure comprises an organic or inorganic material and is placed around the circuit before the fill material is poured and cured. Ring structures 308A and 308B may be formed on the substrate by dispensing materials such as thermoset epoxy, glue, and/or adhesive on substrate 303 around circuit 302, which is similar to an "overmold" process. For example, in an overmold process, overmold material is injected into a mold that has the package inside. The mold then compresses the overmold material around the package and applies heat to allow the material to cure and bond to the package. It is to be understood that other processes may be used as well to form the ring structures.

Semiconductor device 300 may include other components as well, such as a stiffener ring that includes regions 301A and 302B that provide mechanical support.

Figure 4:
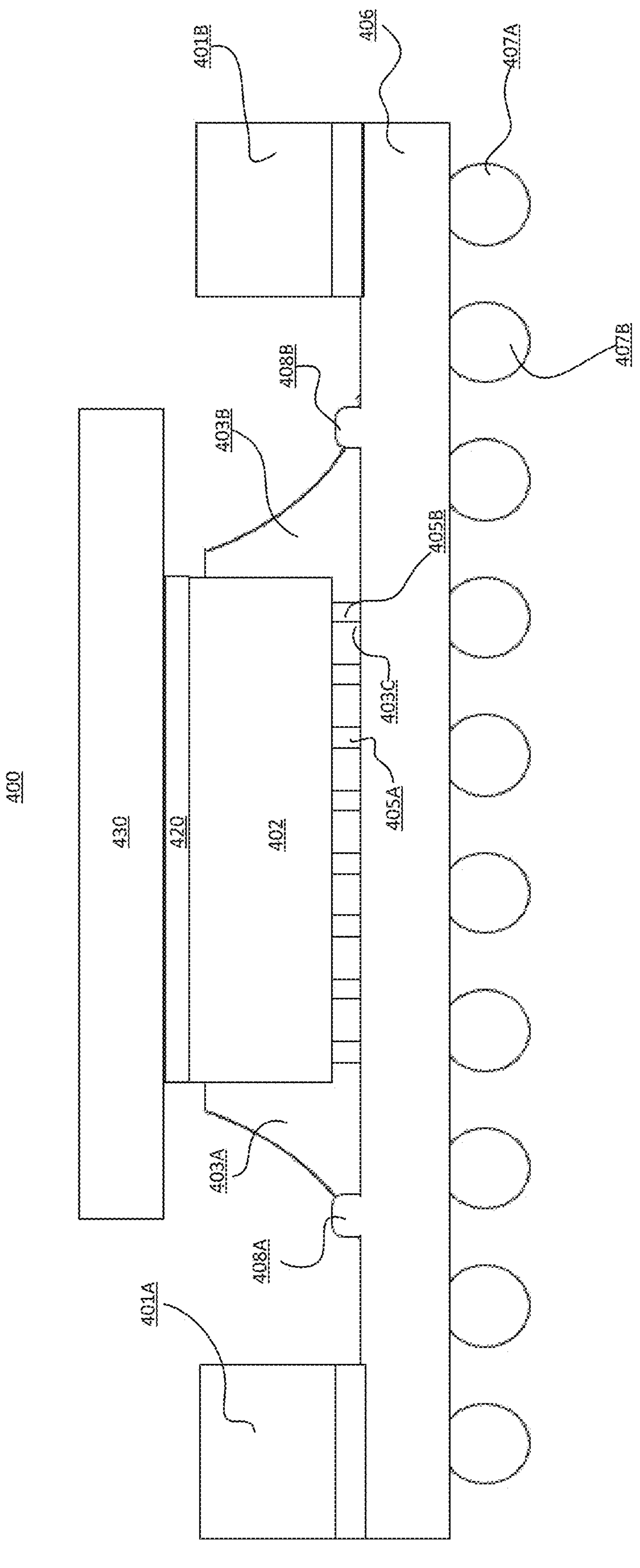
FIG. 4 is a simplified diagram illustrating a semiconductor device with an underfill support structure positioned between integrated ring structures according to embodiments of the present invention.

FIG. 4 is a simplified diagram illustrating a semiconductor device with an underfill support structure positioned between integrated ring structures according to embodiments of the present invention. This diagram is merely an example, which should not unduly limit the scope of the claims. One of ordinary skill in the art would recognize many variations, alternatives, and modifications.

Semiconductor device 400 as illustrated in FIG. 4, includes substrate 406. As an example, a substrate may serve as the base material for mounting and interconnecting the active components, such as transistors, diodes, and integrated circuits. For example, substrate 406 may be made of a composite material that is an insulator, such as ceramic or fiberglass. Depending on the implementation, substrate 406 can have one or more metal layers added to it, forming a metal-insulator-metal or metal-insulator-semiconductor structure, which allows for the electrical connections between the active components and to the external environment. These metal layers can be patterned to form interconnections, bond pads, and other features that allow for the electrical and mechanical connection of the package to the outside world. In some packages, such as ball grid array packages, substrate 406 may also include a layer of conductive balls or bumps that provide the electrical connection to the external environment. The substrate in a semiconductor package can also have via holes or trenches filled with metal to provide electrical connections between metal layers or to the opposite side of the substrate.

Substrate 406 includes a top surface and a bottom surface as shown. For example, the top surface includes electrical contacts (e.g., through MIMI or MIS structures) for coupling to circuit 402. For example, electrical contacts include conductive points or surfaces that allow electrical current to flow between two or more electrical devices or components, providing a path for the flow of electrons and allowing the transfer of electrical energy and signals. Electrical contacts can be made of various materials, such as metals (such as copper, gold, and silver), alloys, or conductive polymers. The bottom surface of substrate 406 also includes electrical contacts, which are directly coupled to electrical connections 407A, 407B, and others. As an example, electrical connections may include BGA balls, solder connections, wires, and others.

Circuit 402 is electrically coupled to the electrical contacts of the substrate via electrical connections (e.g., electrical connections 405A, 405B, and others). In various embodiments, electrical connections comprise solder joints that provide both electrical and mechanical coupling between circuit 402 and substrate 406. As an example, circuit 402 comprises an integrated circuit, and it may also be referred to as a chip, or die, depending on context. As an example, the soldering process for coupling the substrate and circuit 402 involves using a metal alloy (solder) that is melted and then solidified to create a strong mechanical and electrical bond. The soldering process can be performed using various techniques, including surface-mount technology, reflow soldering, or others.

Layer 420 is provided between circuit 402 and heat sink 430. As explained above, thermal interface material is a material used to improve the thermal conductivity between circuit 402 and heat sink 430. Layer 420 fills the gap between circuit 420 and the heat sink 430, reducing the thermal resistance and allowing heat to be efficiently transferred from circuit 402 to the heat sink. For example, TIM comprises one or more materials with high thermal conductivity, such as metals (such as aluminum, copper, or silver), ceramics, or polymer composites. Depending on the implementation, TIM can be in the form of a paste, a sheet, or a pre-formed shape that is placed between circuit 402 and heat sink 430. Heat sink 430, thermally coupled to circuit 402 via layer 320, dissipates heat generated by circuit 402. Heat sink 430 acts as a thermal conduit, transferring the heat generated by circuit 402 to the environment, thereby keeping the temperature of circuit 402 within acceptable limits. For example, the heat sink comprises materials with high thermal conductivity, such as aluminum, copper, or graphite. Depending on the implementation, the heat sink can be in the form of a simple block, a finned structure, or a more complex shape with multiple fins.

Heat sink 430 has a large surface area (e.g., larger than the surface area of circuit 420) to maximize heat dissipation. When a heat sink is coupled to a circuit only via a layer of TIM without heat spreaders, thermal conductivity and reliably are improved compared to approaches that involve heat spreaders and additional TIM layers. At the same time, direct mounting (e.g., without a layer of TIM and heat spread between) of a heat sink on a circuit may cause mechanical and other issues illustrated in FIG. 1 and described above. For example, tilting of a heat sink (e.g., due to physical impact, movement, etc.) may cause damage to the circuit and undesirable separation from the TIM. As shown in FIG. 4, filling material (e.g., including regions 403A, 403B, and 403C) is provided between circuit 402 and ring structures (e.g., 408A and 408B in FIG. 3). For example, region 403A provides support on the left side of circuit 402, and region 403B provides support on the right side of circuit 402.

Region 403A of the filling material is positioned between ring structure 408A and circuit 402, and region 403B is provided between ring structure 408B and circuit 402. According to various implementations, the height of ring structures 408A and 408B is preferably between 20 μm and half of the height of circuit 402 (e.g., 20 um≤h≤½ die height), and may be between 10 μm and the height of circuit 402 (e.g., 20 um≤h≤½ die height). In various implementations, the height of the ring structure matches the desired thickness of the encapsulation material, and the width is wide enough to provide a stable foundation for the molding process.

As an example, filling material (e.g., including regions 403A, 403B, and 403C in FIG. 4) may refer to an underfill. Underfill is a process in which a material is filled in between the circuit and the substrate to enhance the mechanical stability and reliability of the package. In various embodiments, the filling material comprises resin (e.g., semi-transparent and/or translucent) and filler material. For example, the underfill material may comprise a thermosetting epoxy resin that is dispensed as a liquid between the circuit and the substrate, and then cured to form a solid. Filling material, illustrated in FIG. 4, provides support and helps to distribute stress from circuit 402 to substrate 406, reducing the thermal stress and mechanical stress that circuit 402 would otherwise experience during thermal cycling and mechanical shock, especially with a heat sink mounted on its top via a TIM later. Among other features, filling material improves the reliability and performance of semiconductor device 400. The filling material can also provide electrical and thermal benefits. For example, it can improve the electrical performance by reducing parasitic capacitance between circuit 402 and substrate 406, which as shown are connected to each other via electrical connections 405A, 405B, and other solder points. In various embodiments, filling material is thermally conductive and can help to dissipate heat generated by circuit 402.

As an example, a ring structure refers to a raised structure that provides a physical barrier to contain the flow of filling material (e.g., 403A and 403B), and it prevents the filling material into undesired regions (e.g., the region between ring structure 408A and stiffener ring 401A). In various embodiments, ring structures 408A and 408B are formed as a part of substrate 406. In a specific embodiment, ring structures 408A and 480B are made during substrate manufacturing process using solder mask. Other manufacturing techniques may be used as well.

Semiconductor device 400 may include other components as well, such as stiffener ring that includes regions 401A and 402B that provide mechanical support and/or insulation.

Figure 5:
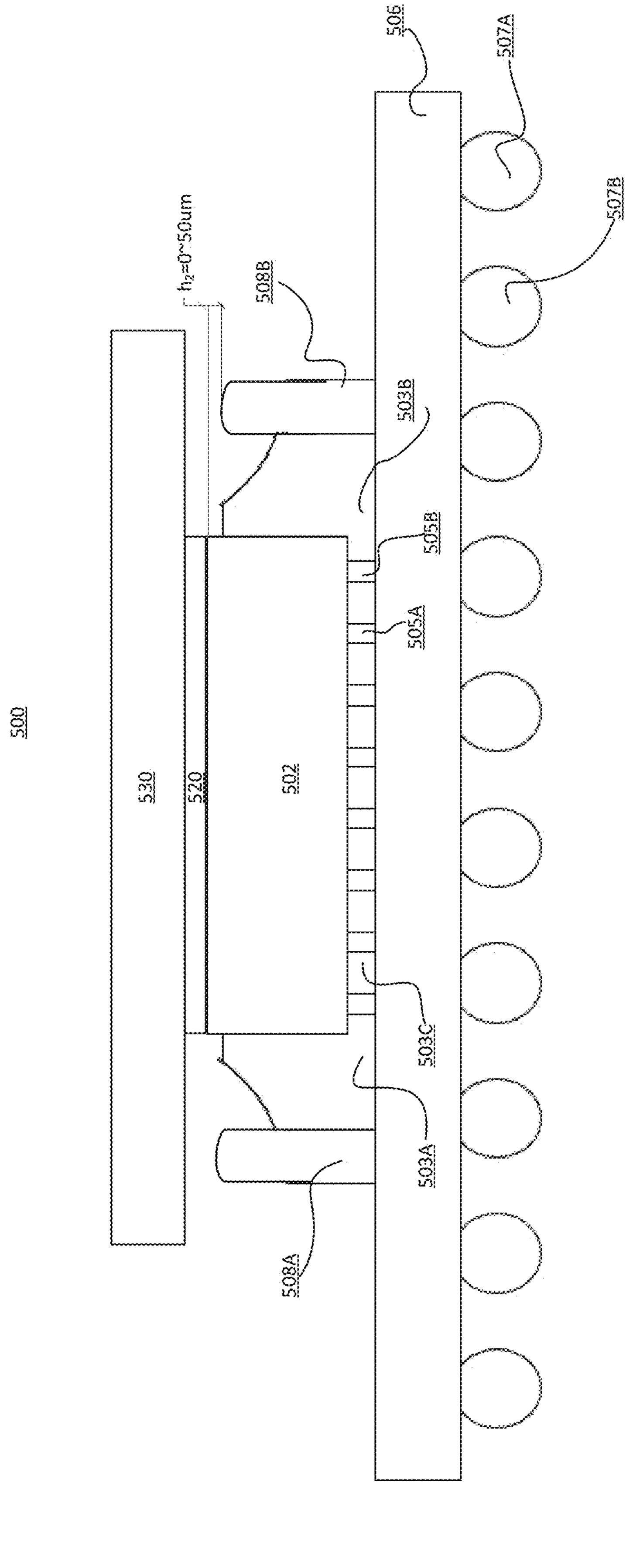
FIG. 5 is a simplified diagram illustrating a semiconductor device with an underfill support structure positioned between ring structures formed by solder mask material according to embodiments of the present invention.

FIG. 5 is a simplified diagram illustrating a semiconductor device with an underfill support structure positioned between ring structures formed by solder mask material according to embodiments of the present invention. This diagram is merely an example, which should not unduly limit the scope of the claims. One of ordinary skill in the art would recognize many variations, alternatives, and modifications.

Semiconductor device 500 as illustrated in FIG. 5, includes substrate 506. As an example, a substrate may serve as the base material for mounting and interconnecting the active components, such as transistors, diodes, and integrated circuits. For example, substrate 506 may be made of a material that is an insulator or a low-resistivity conductor, such as ceramic or fiberglass. Depending on the implementation, substrate 506 can have one or more metal layers added to it, forming a metal-insulator-metal or metal-insulator-semiconductor structure, which allows for the electrical connections between the active components and to the external environment. These metal layers can be patterned to form interconnections, bond pads, and other features that allow for the electrical and mechanical connection of the package to the outside world. In some packages, such as ball grid array packages, substrate 506 may also include a layer of conductive balls or bumps that provide the electrical connection to the external environment. The substrate in a semiconductor package can also have via holes or trenches filled with metal to provide electrical connections between metal layers or to the opposite side of the substrate.

Substrate 506 includes a top surface and a bottom surface as shown. For example, the top surface includes electrical contacts (e.g., through MIMI or MIS structures) for coupling to circuit 502. For example, electrical contacts include conductive points or surfaces that allow electrical current to flow between two or more electrical devices or components, providing a path for the flow of electrons and allowing the transfer of electrical energy and signals. Electrical contacts can be made of various materials, such as metals (such as copper, gold, and silver), alloys, or conductive polymers. The bottom surface of substrate 506 also includes electrical contacts, which are directly coupled to electrical connections 507A, 507B, and others. As an example, electrical connections may include BGA balls, solder connections, wires, and others.

Circuit 502 is electrically coupled to the electrical contacts of the substrate via electrical connections (e.g., electrical connections 505A, 505B, and others). In various embodiments, electrical connections comprise solder points that provide both electrical and mechanical coupling between circuit 502 and substrate 506. As an example, circuit 502 comprises an integrated circuit, and it may also be referred to as a chip, or die, depending on context. As an example, the soldering process for coupling the substrate and circuit 502 involves using a metal alloy (solder) that is melted and then solidified to create a strong mechanical and electrical bond. The soldering process can be performed using various techniques, including surface-mount technology, reflow soldering, or others.

Layer 520 is provided between circuit 502 and heat sink 530. As explained above, thermal interface material is a material used to improve the thermal conductivity between circuit 502 and heat sink 530. Layer 520 fills the gap between circuit 520 and the heat sink 530, reducing the thermal resistance and allowing heat to be efficiently transferred from circuit 502 to the heat sink. For example, TIM comprises one or more materials with high thermal conductivity (e.g., at least 0.01 W/cm-K, but may be as high as 0.1 W/cm-K), such as metals (such as aluminum, copper, or silver), ceramics, or polymer composites. Depending on the implementation, TIM can be in the form of a paste, a sheet, or a pre-formed shape that is placed between circuit 502 and heat sink 530. Heat sink 530, thermally coupled to circuit 502 via layer 520, dissipates heat generated by circuit 502. Heat sink 530 acts as a thermal conduit, transferring the heat generated by circuit 502 to the environment, thereby keeping the temperature of circuit 502 within acceptable limits. For example, the heat sink comprises materials with high thermal conductivity, such as aluminum, copper, or graphite. Depending on the implementation, the heat sink can be in the form of a simple block, a finned structure, or a more complex shape with multiple fins.

Heat sink 530 has a large surface area (e.g., larger than the surface area of circuit 520) to maximize heat dissipation. When a heat sink is coupled to a circuit only via a layer of TIM without heat spreaders, thermal conductivity and reliably are improved compared to approaches that involve heat spreaders and additional TIM layers. At the same time, direct mounting (e.g., without a layer of TIM between) of a heat sink on a circuit may cause mechanical and other issues illustrated in FIG. 1 and described above. For example, tilting of a heat sink (e.g., due to physical impact, movement, etc.) may cause damage to the circuit and undesirable separation from the TIM. As shown in FIG. 5, filling material (e.g., including regions 503A, 503B, and 503C) is provided between circuit 502 and ring structures (e.g., 508A and 508B in FIG. 5). For example, region 503A provides support on the left side of circuit 502, and region 503B provides support on the right side of circuit 502.

Region 503A of the filling material is positioned between ring structure region 508A and circuit 502, and region 503B is provided between ring structure region 508B and circuit 502. For example, region 508A and region 508B are portions of a ring structure that surrounds the filling material. The top of region 508A is almost as tall as the top surface of circuit 502. For example, the distance (e.g., $h_2$ in FIG. 5) between the top surface of circuit 502 and ring structure region 508B is no greater than 50 um. In various implementations, ring structures may be attached to substrate 503 using epoxy, adhesive, and/or other material. It is to be appreciated the height of ring structure provides package support and prevent a potentially tiling heat sink from damaging circuit 502. For example, in case of a tiling heat sink (e.g., as shown in FIG. 1), the tall ring structure as shown in FIG. 5 limits the amount tilting of heat sink 530; in the case of a tilting heat sink, the ring structures may temporarily serve as a pillar that supports the ring structure.

As an example, filling material (e.g., including regions 503A, 503B, and 503C in FIG. 5) may refer to an underfill. Underfill is a process in which a material is filled in between the circuit and the substrate to enhance the mechanical stability and reliability of the package. In various embodiments, the filling material comprises resin (e.g., semi-transparent and/or translucent) and filler material. For example, the underfill material may comprise a thermosetting epoxy resin that is dispensed as a liquid between the circuit and the substrate, and then cured to form a solid. Filling material, illustrated in FIG. 5, provides support and helps to distribute stress from circuit 502 to substrate 506, reducing the thermal stress and mechanical stress that circuit 502 would otherwise experience during thermal cycling and mechanical shock, especially with a heat sink mounted on its top via a TIM later. Among other features, filling material improves the reliability and performance of semiconductor device 500. The filling material can also provide electrical and thermal benefits. For example, it can improve the electrical performance by reducing parasitic capacitance between circuit 502 and substrate 506, which as shown are connected to each other via electrical connections 505A, 505B, and other solder points. In various embodiments, filling material is thermally conductive and can help to dissipate heat generated by circuit 502.

As an example, a ring structure refers to a raised structure that provides a physical barrier to contain the flow of filling material (e.g., 503A and 503B), and it prevents the filling material into undesired regions (e.g., the region between ring structure 508A and stiffener ring region 501A). Depending on the implementation, the ring structure may include copper, stainless steel, kovar, copper tungsten, metal alloys, ceramic, and/or other materials. For example, the ring structure may be coupled to the substrate using glue, adhesive, thermoset epoxy, and/or other materials. In various embodiments, ring structure regions 508A and 508B are formed using solder mask material. As an example, solder mask material refers to a protective coating applied over the surface of the substrate or circuit to prevent oxidation and contamination during the soldering process. Solder mask material may comprise a polymer that is applied to the surface of the device using a photolithography process or a screen printing process. The solder mask material may be applied in multiple layers, with each layer serving a specific purpose such as reducing electrical leakage, preventing solder bridging, or protecting against environmental factors. The material is often formulated to be heat-resistant and able to withstand the high temperatures associated with the soldering process. In various embodiments, multiple layers or processes may be applied to obtain desired height for the ring structure.

Figure 6A:
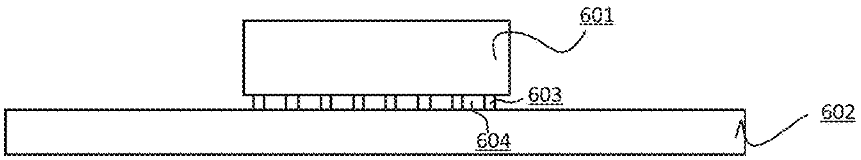
FIGS. 6A-6D are simplified diagrams illustrating a method for packaging an integrated circuit device according to embodiments of the present invention.
Figure 6B:
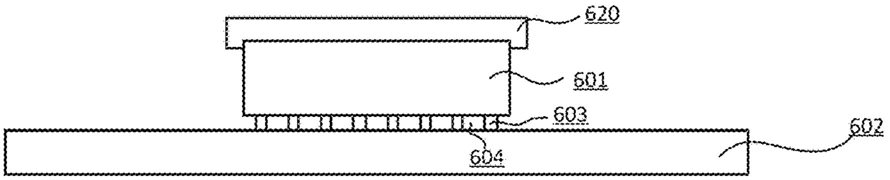
Figure 6C:
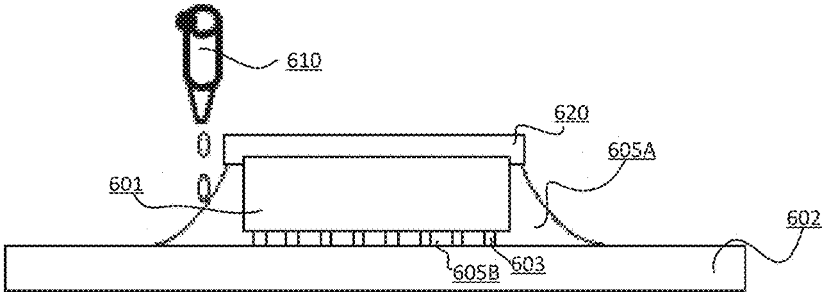
Figure 6D:
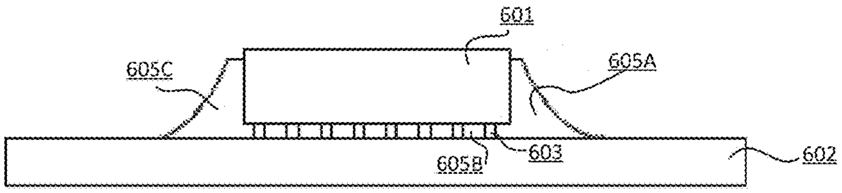

FIGS. 6A-6D are simplified diagrams illustrating a method for packaging an integrated circuit device according to embodiments of the present invention. This diagram is merely an example, which should not unduly limit the scope of the claims. One of ordinary skill in the art would recognize many variations, alternatives, and modifications. As an example, one or more steps may be added, removed, repeated, replaced, modified, rearranged, and/or overlapped, and they should not limit the scope of the claims. As shown in FIG. 6A, circuit 601 is attached to substrate 602 via connectors (e.g., connector 603 as one of the connectors). For example, circuit 601 is soldered onto substrate 602 in a flip chip configuration. Before filling material is provided, spaces (e.g., space 604) exist between circuit 601 and substrate 602. In FIG. 6B, tape 620 is applied on the top surface of circuit 601. In various embodiments, tape 602 is larger than the top surface of circuit 601, but other tape sizes are possible as well. Depending on the implementation, tape 620 can have various shapes and/or cutouts to facilitate dispensing filling material in the subsequent steps. For example, tape 602 comprises containment tape, which is sometimes also referred to as barrier tape. In some embodiments, tape 602 comprises cleanroom-grade polymer film with an adhesive coating on one side. As tape 602 is to be later removed, tape 602 comprises an adhesive that leaves minimal residue when removed. As illustrated in FIG. 6C, filling material (including region 605A and 605B) is provided on the semiconductor device using a dispensing mechanism 610. As shown in FIG. 6C, the filling material, which may be an underfill as explained above, is filled up to tape 620, and it does not reach the top surface of circuit 601. The filling material fills up the space between circuit 601 and substrate 602. After the filling material is cured, tape 620 is removed, as shown in FIG. 6D. As shown in FIG. 6D, regions 605C and 605A are close to the top surface of circuit 601 within a predetermined proximity as explained above. Additional steps, such as the formation of the TIM layer and attachment of heat sink may be performed as well.

FIGS. 7A-7E are simplified diagrams illustrating a method for packaging an integrated circuit device with ring structures according to embodiments of the present invention. This diagram is merely an example, which should not unduly limit the scope of the claims. One of ordinary skill in the art would recognize many variations, alternatives, and modifications. As an example, one or more steps may be added, removed, repeated, replaced, modified, rearranged, and/or overlapped, and they should not limit the scope of the claims.

Figure 7A:
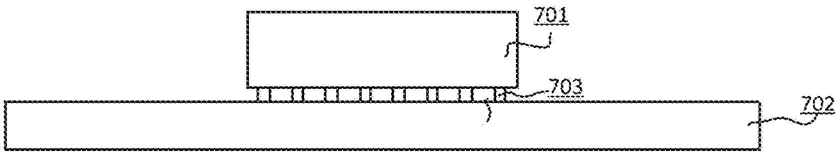
FIGS. 7A-7E are simplified diagrams illustrating a method for packaging an integrated circuit device with ring structures according to embodiments of the present invention.
Figure 7B:
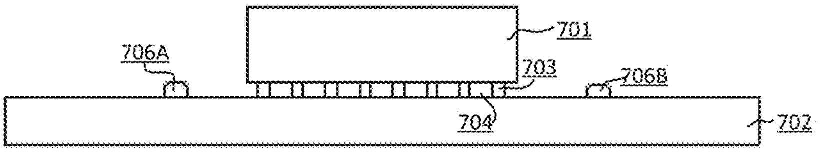
Figure 7C:
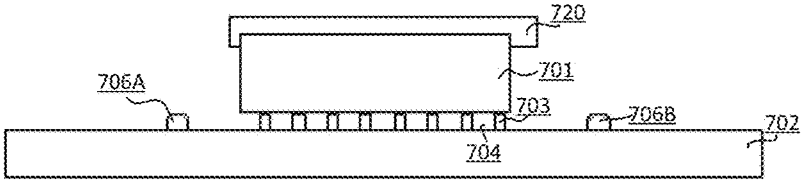
Figure 7D:
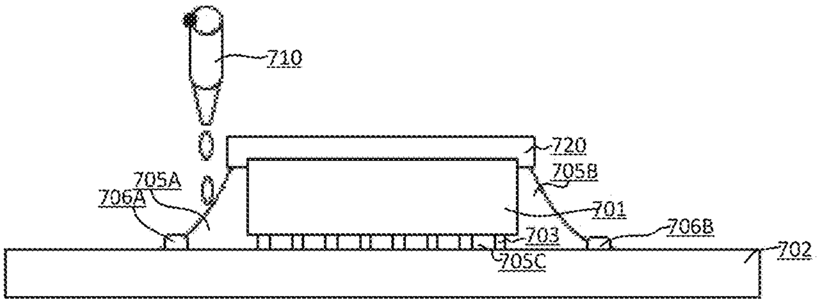
Figure 7E:
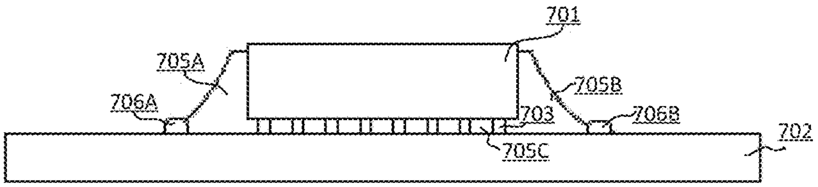

As shown in FIG. 7A, circuit 701 is attached to substrate 702 via connectors (e.g., connector 703 as one of the connectors). For example, circuit 701 is soldered onto substrate 702 in a flip chip configuration. Before filling material is provided, spaces (e.g., space 704) exist between circuit 701 and substrate 702. FIG. 7B shows the formation of ring structures 706A and 706B. For example, ring structures may be formed by dispending materials at locations as shown. In FIG. 7C, tape 720 is applied on the top surface of circuit 701. In various embodiments, tape 702 is larger than the top surface of circuit 701, but other tape sizes are possible as well. Depending on the implementation, tape 720 can have various shapes and/or cutouts to facilitate dispensing filling material in the subsequent steps. For example, tape 702 comprises containment tape, which is sometimes also referred to as barrier tape. In some embodiments, tape 702 comprises cleanroom-grade polymer film with an adhesive coating on one side. As tape 702 is to be later removed, tape 702 comprises an adhesive that leaves minimal residue when removed. As illustrated in FIG. 7D, filling material (including region 705A and 705B) is provided on the semiconductor device using a dispensing mechanism 710. As shown in FIG. 7D, the filling material, which may be an underfill as explained above, is filled up to tape 720, and it does not reach the top surface of circuit 701. The filling material fills up the space between circuit 701 and substrate 702. The filling material is prevented from spilling outside the spaces defined by ring structures 706A and 706B. After the filling material is cured, tape 720 is removed, as shown in FIG. 7E. As shown in FIG. 7E, regions 705C and 705A are close to the top surface of circuit 701 within a predetermined proximity as explained above. Additional steps, such as the formation of the TIM layer and attachment of heat sink may be performed as well.

FIGS. 8A-8E are simplified diagrams illustrating a method for packaging an integrated circuit device with ring structures that are integrated on a substrate according to embodiments of the present invention. This diagram is merely an example, which should not unduly limit the scope of the claims. One of ordinary skill in the art would recognize many variations, alternatives, and modifications. As an example, one or more steps may be added, removed, repeated, replaced, modified, rearranged, and/or overlapped, and they should not limit the scope of the claims.

Figure 8A:
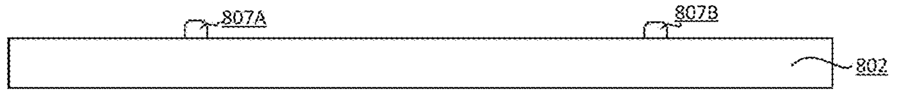
FIGS. 8A-8E are simplified diagrams illustrating a method for packaging an integrated circuit device with ring structures that are integrated on a substrate according to embodiments of the present invention.
Figure 8B:
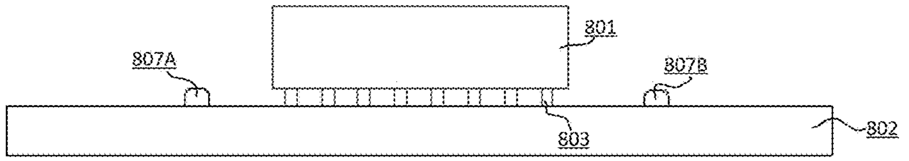
Figure 8C:
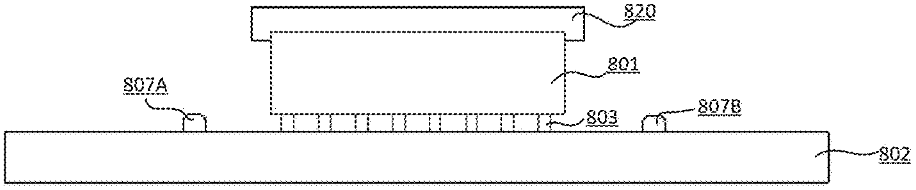
Figure 8D:
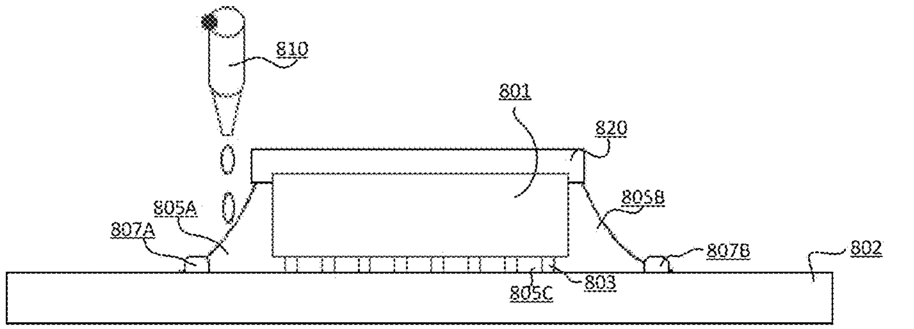
Figure 8E:
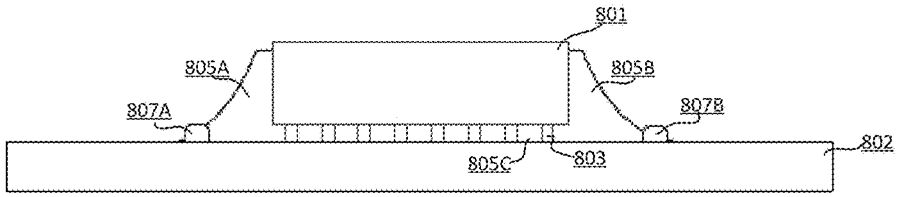

As shown in FIG. 8A, substrate 802 is provided with ring structure regions 807A and 807B. For example, ring structure regions 807A and 807B may be formed during the substrate manufacturing process using solder mask, and other processes and techniques are possible as well. In FIG. 8B, circuit 801 is attached to substrate 802 via connectors (e.g., connector 803 as one of the connectors). For example, circuit 801 is soldered onto substrate 802 in a flip chip configuration. Before filling material is provided, spaces (e.g., space 804) exist between circuit 801 and substrate 802. In FIG. 8C, tape 820 is applied on the top surface of circuit 801. In various embodiments, tape 802 is larger than the top surface of circuit 801, but other tape sizes are possible as well. Depending on the implementation, tape 820 can have various shapes and/or cutouts to facilitate dispensing filling material in the subsequent steps. For example, tape 802 comprises containment tape, which is sometimes also referred to as barrier tape. In some embodiments, tape 802 comprises cleanroom-grade polymer film with an adhesive coating on one side. As tape 802 is to be later removed, tape 802 comprises an adhesive that leaves minimal residue when removed. As illustrated in FIG. 8D, filling material (including region 805A and 805B) is provided on the semiconductor device using a dispensing mechanism 810. As shown in FIG. 8D, the filling material, which may be an underfill as explained above, is filled up to tape 820, and it does not reach the top surface of circuit 801. The filling material fills up the space between circuit 801 and substrate 802. The filling material is prevented from spilling outside the spaces defined by ring structure regions 807A and 807B. After the filling material is cured, tape 820 is removed, as shown in FIG. 8E. As shown in FIG. 8E, regions 805C and 805A are close to the top surface of circuit 801 within a predetermined proximity as explained above. Additional steps, such as the formation of the TIM layer and attachment of heat sink may be performed as well.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. A semiconductor device comprising:

a substrate comprising a first top surface and a first bottom surface, the first top surface comprising a first plurality of electrical contacts;

a first plurality of electrical connections directly coupled to the first plurality of electrical contacts;

a circuit comprising a second top surface and a second bottom surface, the second bottom surface comprising a second plurality of electrical contacts, the second plurality of electrical contacts being directly coupled to the first plurality of electrical connections, the circuit further comprising a first side surface and a second side surface;

a ring structure coupled to the substrate and positioned around the circuit, the ring structure comprising a third top surface, a height difference between the second top surface and the third top surface being less than 100 μm; and a filling material comprising a first portion and a second portion, the first portion being directly coupled to the first plurality of electrical connections and the second bottom surface, the second portion being in direct contact with the first side surface, the filling material being positioned between the circuit and the ring structure, the filling material being thermally conductive and comprising a thermosetting epoxy resin, a top region of the second portion being characterized by a width of at least 15 μm and a distance of less than 50 μm from the second top surface of the circuit to provide structural support for the circuit.

2. The semiconductor device of claim 1, further comprising a second plurality of electrical connections directly coupled to the first bottom surface.

3. The semiconductor device of claim 1, wherein:

the second portion comprises a third side surface and a fourth side surface;

the third side surface is in direct contact with the first side surface; and the fourth side surface is in direct contact with the ring structure.

4. The semiconductor device of claim 3, wherein, the height difference is no greater than 50 um.

5. The semiconductor device of claim 3, wherein the ring structure is coupled to the substrate using a glue material, an adhesive material, and/or a thermoset epoxy material.

6. The semiconductor device of claim 5, wherein the ring structure comprises a solder mask material, a copper material, a stainless steel material, a kovar material, a copper tungsten material, a metal alloy material, and/or a ceramic material.

7. The semiconductor device of claim 5, wherein a fifth side surface is at least 20 um below the second top surface.

8. The semiconductor device of claim 7, wherein the circuit is characterized by a first height, the fifth side surface being at least one-eighth of the first height below the second top surface.

9. The semiconductor device of claim 1, wherein the ring structure is characterized by a square shape, a rectangular shape, or a circular shape.

10. The semiconductor device of claim 1, wherein the first bottom surface comprises a second plurality of electrical contacts, the first plurality of electrical contacts being coupled to the second plurality of electrical contacts.

11. The semiconductor device of claim 1, wherein the ring structure is coupled to the substrate using an epoxy material or an adhesive material.

12. The semiconductor device of claim 1, wherein the filling material comprises an epoxy material.

13. The semiconductor device of claim 1, wherein the filling material comprises an adhesive material.

14. The semiconductor device of claim 1, wherein the filling material comprises a resin material.

15. The semiconductor device of claim 1, wherein the second portion comprises a third side surface, the third side surface is characterized by a curved profile.

16. The semiconductor device of claim 1, wherein the first plurality of electrical connections comprises a solder material.

17. A semiconductor device comprising:

a substrate comprising a first top surface and a first bottom surface, the first top surface comprising a first plurality of electrical contacts, the first bottom surface comprising a second plurality of electrical contacts, the substrate further comprising a ring structure;

a first plurality of electrical connections directly coupled to the first plurality of electrical contacts, the first plurality of electrical connections being positioned within the ring structure;

a second plurality of electrical connections directly coupled to the second plurality of electrical contacts;

a circuit comprising a second top surface and a second bottom surface, the second bottom surface comprising a second plurality of electrical contacts, the second plurality of electrical contacts being directly coupled to the first plurality of electrical connections, the circuit further comprising a first side surface and a second side surface; and a filling material comprising a first portion and a second portion, the first portion being directly coupled to the first plurality of electrical connections and the second bottom surface, the second portion being in direct contact with the first side surface and the ring structure, the filling material being thermally conductive and comprising a thermosetting epoxy resin, a top region of the second portion being characterized by a width of at least 15 μm and a distance of less than 50 μm from the second top surface of the circuit to provide structural support for the circuit.

18. The semiconductor device of claim 17, wherein the second plurality of electrical connections comprises a ball grid array.

19. A semiconductor device comprising:

a substrate comprising a first top surface and a first bottom surface, the first top surface comprising a first plurality of electrical contacts, the first bottom surface comprising a second plurality of electrical contacts;

a ring structure positioned on a first location of the first top surface;

a first plurality of electrical connections directly coupled to the first plurality of electrical contacts, the first plurality of electrical connections being positioned within the ring structure;

a circuit comprising a second top surface and a second bottom surface, the second bottom surface comprising a second plurality of electrical contacts, the second plurality of electrical contacts being directly coupled to the first plurality of electrical connections, the circuit further comprising a first side surface and a second side surface; and a filling material comprising a first portion and a second portion, the first portion being directly coupled to the first plurality of electrical connections and the second bottom surface, the second portion being in direct contact with the first side surface and the ring structure, the filling material being thermally conductive and comprising a thermosetting epoxy resin, a top region of the second portion being characterized by a width of at least 15 μm and a distance of less than 50 μm from the second top surface of the circuit to provide structural support for the circuit.

20. The semiconductor device of claim 19, wherein the filling material comprises a third portion positioned w the circuit and the ring structure.

* * * * *